(12) United States Patent
McEachern

(10) Patent No.: US 9,383,397 B1
(45) Date of Patent: Jul. 5, 2016

(54) SYSTEM AND METHOD FOR MEASURING A PARAMETER OF AN ALTERNATING CURRENT POWER GRID WHILE MINIMIZING THE LIKELIHOOD OF LIGHTNING DAMAGE IN A MEASURING SYSTEM

(75) Inventor: Alexander McEachern, Oakland, CA (US)

(73) Assignee: Power Standard Laboratory, Inc., Alameda, CA (US)

( * ) Notice: Subject to any disclaimer, the term of this patent is extended or adjusted under 35 U.S.C. 154(b) by 1010 days.

(21) Appl. No.: 13/562,049

(22) Filed: Jul. 30, 2012

(51) Int. Cl.
*G01R 15/18* (2006.01)
*G01R 31/36* (2006.01)
*G01R 31/00* (2006.01)
*G01R 15/00* (2006.01)

(52) U.S. Cl.
CPC ............. *G01R 31/00* (2013.01); *G01R 15/00* (2013.01)

(58) Field of Classification Search
CPC .... G01R 35/005; G01R 31/40; G01R 31/025; H02J 5/005; H02J 7/025; H02J 17/00; G05B 15/02; G05B 19/4099; G05B 2219/35134
USPC .............. 324/74, 130, 202, 750.02, 601, 650, 324/120, 617, 76.35, 76.54, 89, 510–511, 324/764.01, 771; 700/286; 307/43; 702/59–66, 182
See application file for complete search history.

(56) References Cited

U.S. PATENT DOCUMENTS

| 7,557,563 | B2 * | 7/2009 | Gunn | ................. | G01R 1/22 324/117 H |
| 2005/0017751 | A1 * | 1/2005 | Gunn | ................. | G01R 15/142 324/764.01 |

* cited by examiner

*Primary Examiner* — Patrick Assouad
*Assistant Examiner* — Taqi Nasir
(74) *Attorney, Agent, or Firm* — Lessani Law Group, PC

(57) ABSTRACT

A system and method are provided for measuring a parameter of an alternating current power grid relative to a calibrated fourth signal. The method includes receiving a first signal at an antenna and transmitting it to a signal receiver. A second signal is generated at the signal receiver. A third signal is generated based on the second signal and electrically isolated from the second signal. The third signal is transmitted in the cable toward the measuring device. A fourth signal is generated based on the third signal and electrically isolated from the third signal. The fourth signal, which is calibrated by subtracting a delay constant from the generated fourth signal, is transmitted to the measuring device. The delay constant approximates the delay between receipt of the first signal at the antenna and receipt of the fourth signal at the measuring device.

18 Claims, 4 Drawing Sheets

SYSTEM AND METHOD FOR MEASURING A PARAMETER OF AN ALTERNATING CURRENT POWER GRID WHILE MINIMIZING THE LIKELIHOOD OF LIGHTNING DAMAGE IN A MEASURING SYSTEM

BACKGROUND OF THE INVENTION

1. Field of the Invention

This invention relates generally to a power grid system and, more particularly, a system and method for measuring a parameter of an alternating current power grid while minimizing the likelihood of lightning damage to a measuring system.

2. Description of the Background Art

Various devices measure parameters on an alternating current power grid. These devices may be located on infrastructure within the power grid or in individual homes and businesses attached to the power grid.

Some measuring devices measure a parameter on the power grid relative to a signal received via an antenna. For example, Phasor Measuring Units (PMUs) and Micro Phasor Measuring Units (µPMUs) may measure voltage phase angles relative to a Global Positioning System (GPS) timing signal received from GPS satellites. The GPS timing signal is received through an antenna, which may be exposed to the sky in order to maximize signals from the GPS satellites. This exposure increases the risk of damage by lightning.

To minimize the risk of lightning damage to a PMU or other measuring system, the antenna and corresponding signal receiver may be electrically isolated from the rest of the measuring system. Typically, in prior art, the antenna is electrically coupled to the signal receiver, and the signal receiver is coupled to the PMU or other measuring system via a signal cable. In prior art this signal cable may be electrically isolated at either the receiver end of the cable or at the measuring device end of the cable. These configurations reduce but do not eliminate lightning problems. For example, the cable between the antenna/signal receiver and the measuring device may be tens or even hundreds of meters long (e.g., if the antenna and receiver are on the roof of a tall building and the measuring device is in the basement of the building) and, even with electrical isolation at one end of the cable, the cable still provides a long electrical path and may still act as a lightning rod. As will be recognized by one skilled in the art, coupling a cable with a long electrical path to a signal receiver may degrade the receiver's signal-to-noise ratio, and coupling a cable with a long electrical path to a measuring device may cause undesired signals to enter the measuring device, commonly radio frequency signals from nearby transmitters and other sources.

Furthermore, electrical isolation and long cables between the signal receiver and the measuring system introduce time delays in the signal. (For timing signals with accuracies on the order of tens of nanoseconds, for example, cable delays become important when the cables are on the order of ten meters long.) The extent of the delay may vary from location to location, especially as the distance from the antenna to the receiver, and the distance from the receiver to the measuring device may vary from location to location. This can reduce timing accuracy when measurements at two different locations need to be synchronized precisely and compared, as in the case with PMUs. Therefore, there is a need for a system and method that enables accurate measurement of a parameter of an alternating current power grid despite timing signal delays, while also minimizing the likelihood of lightning damage to the system.

SUMMARY OF THE INVENTION

The present invention is directed to a system and method for measuring a parameter of an alternating current power grid while minimizing the likelihood of lightning damage to a measuring system, and maximizing the electrical performance of the measuring system.

The method is performed in a measuring system that includes an antenna exposed to the sky, a signal receiver coupled to the antenna, and a measuring device coupled to the signal receiver via a cable. The method involves transmitting a signal from the signal receiver to the measuring device in order to enable the measuring device to measure a parameter relative to a signal. Specifically, a first signal is received at the antenna and transmitted to the signal receiver. The signal receiver generates a second signal. The second signal is electrically isolated from the cable. A third signal is generated based on the second signal, and electrically isolated from the second signal. This third signal is transmitted in the cable towards the measuring device and is electrically isolated from the measuring device. A fourth signal is generated based on the third signal and electrically isolated from the third signal. The fourth signal is transmitted to the measuring device.

Before further use in the measuring device, the fourth signal is calibrated by subtracting a delay constant from the fourth signal. The delay constant approximates the delay between receipt of the first signal at the antenna and a receipt of the fourth signal at the measuring device. In systems where there is a long cable (e.g., 10 meters or more) coupling the antenna and the signal receiver, the expected time for an electrical signal to propagate through the cable between the antenna and the signal receiver is added to the delay constant. A parameter is measured on the alternating current power grid relative to the calibrated fourth signal.

In certain embodiments, a first digital isolation device is used to generate the third signal from the second signal and a second digital isolation device is used to generate the fourth signal from the third signal.

In certain embodiments, the method includes supplying power from the measuring device to the signal receiver. In such embodiments, a first power supply is generated at the measuring device. The first power supply is electrically isolated from the cable. A second power supply, derived from the first power supply and electrically isolated from the first power supply, is generated. The second power supply is transmitted in the cable toward the signal receiver. The second power supply is electrically isolated from the signal receiver. A third power supply, derived from the second power supply and electrically isolated from the second power supply, is generated and transmitted to the signal receiver to supply power to the signal receiver from the measuring device.

In certain embodiments, a first isolated DC-DC converter is used to generate the second power supply from the first power supply and a second isolated DC-DC converter is used to generate the third power supply from the second power supply.

The system includes a measuring device operatively coupled to the alternating current power grid that periodically measures a parameter on the alternating current power grid, a signal receiver for receiving a signal, and a cable for transmitting the signal from the signal receiver to the measuring circuit. Also included are a first electrical isolation device that couples the cable and the signal receiver for electrically isolating the cable from the signal receiver and a second electrical isolation device that couples the cable and the measuring device for electrically isolating the cable from the measuring device. The signal travels from the signal receiver to the measuring device through the first electrical isolation device, along the cable, and then through the second electrical isolation device.

In certain embodiments, the measuring device calibrates the signal by a delay constant to compensate for delay in the cable and the first and second electrical isolation devices. In certain embodiments, the calibration also may compensate for a delay between the antenna and the signal receiver.

In certain embodiments, the delay constant is calculated by adding the specified propagation delays of the first and second electrical isolation devices and the expected time for an electrical signal to propagate through the cable given the length of the cable. In certain embodiments, the delay constant is calculated by comparing a first signal received at the signal receiver with a second signal received at the measuring device at a same point in time, where the difference between the first and second signals at the same point in time is stored as the delay constant.

In certain embodiments, the cable includes at least two pairs of twisted wires for electrically-isolated bi-directional signal flow between the signal receiver and the measuring device and the delay constant is calculated by measuring a round trip signal travel time in the cable and dividing this time by approximately 2.

In certain embodiments, the parameter is a voltage phase angle, the measuring device is a PMU, the first signal is a timing reference signal (e.g., a GPS timing signal from a GPS satellite) against which a voltage phase angle on the alternating current power grid is measured, and the signal receiver is a GPS signal receiver.

DETAILED DESCRIPTION OF THE PREFERRED EMBODIMENTS

The present invention provides a system and method for measuring a parameter (e.g., a voltage phase angle) of an alternating current power grid while minimizing the likelihood of lightning damage to a measuring system including a measuring device (e.g., a phasor measuring unit or PMU), a signal receiver coupled to an antenna exposed to the sky, and a cable connecting the measuring device and the signal receiver.

Figure 1A:
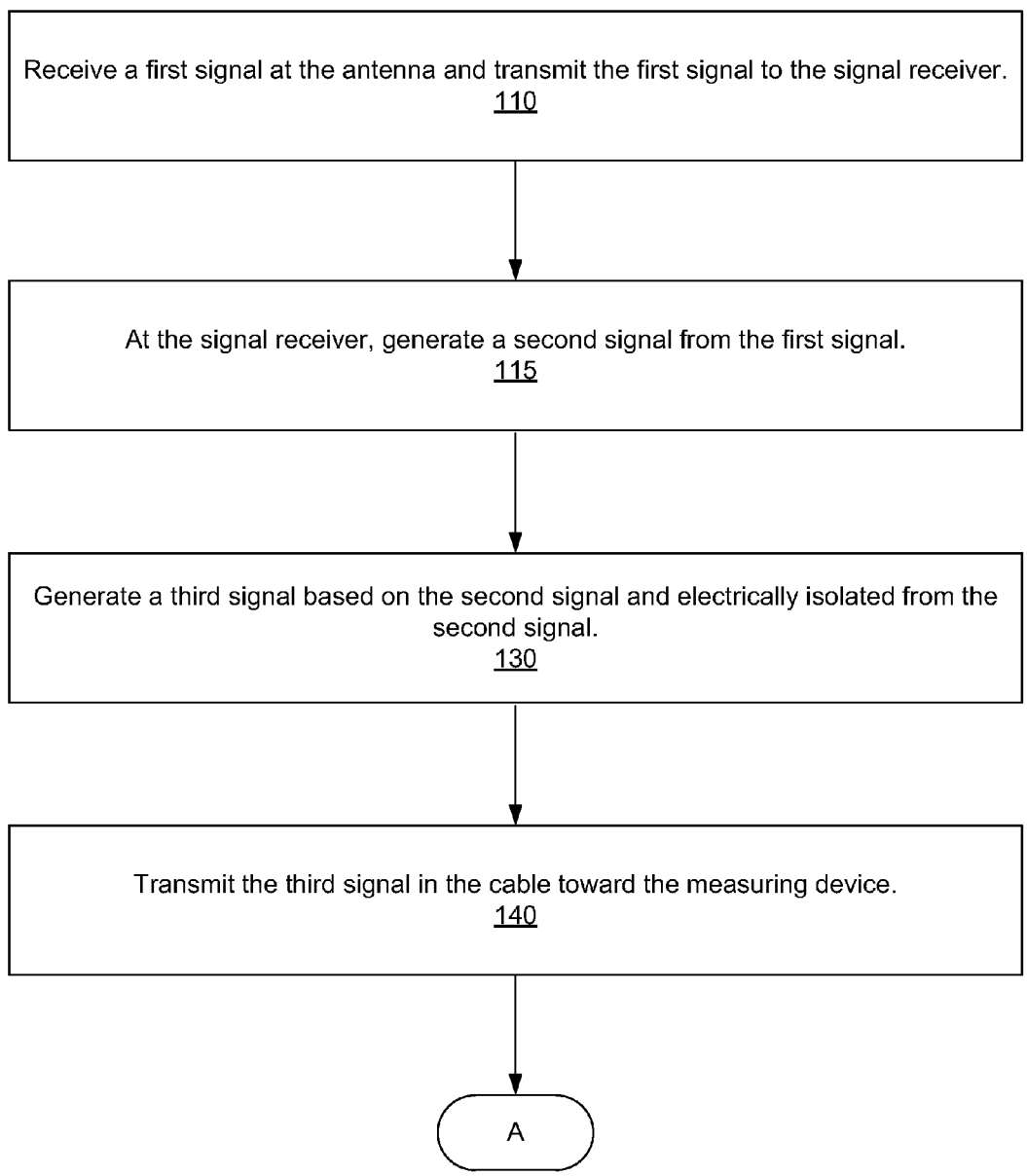
FIGS. 1a-1b are a flowchart that illustrates a method for measuring a parameter of an alternating current power grid according to one embodiment of the invention.
Figure 1B:
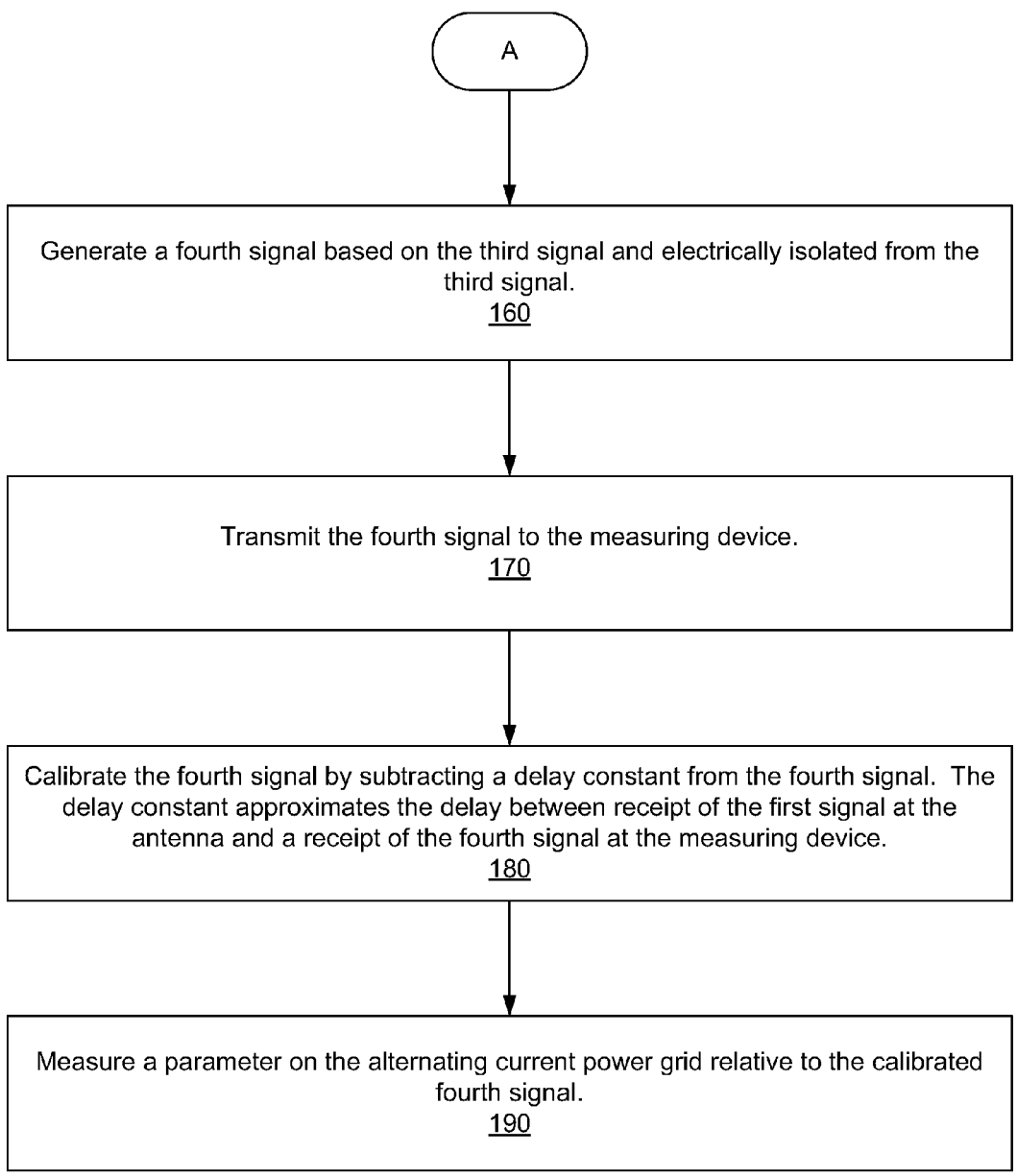

In the preferred embodiment as shown in FIGS. 1a-1b, a first signal is received at the antenna and transmitted to the signal receiver (step 110). A second signal is generated from the first signal at the signal receiver (step 115). A third signal is generated based on the second signal and electrically isolated from the second signal (step 130). The third signal is transmitted in the cable toward the measuring device (step 140). A fourth signal is generated based on the third signal and electrically isolated from the third signal (step 160). The fourth signal is transmitted to the measuring device (step 170). The fourth signal may be calibrated by subtracting a delay constant from the fourth signal. The delay constant approximates the delay between the receipt of the first signal at the antenna and a receipt of the fourth signal at the measuring device (step 180). A parameter is measured on the alternating current power grid relative to the calibrated fourth signal (step 190).

Figure 2:
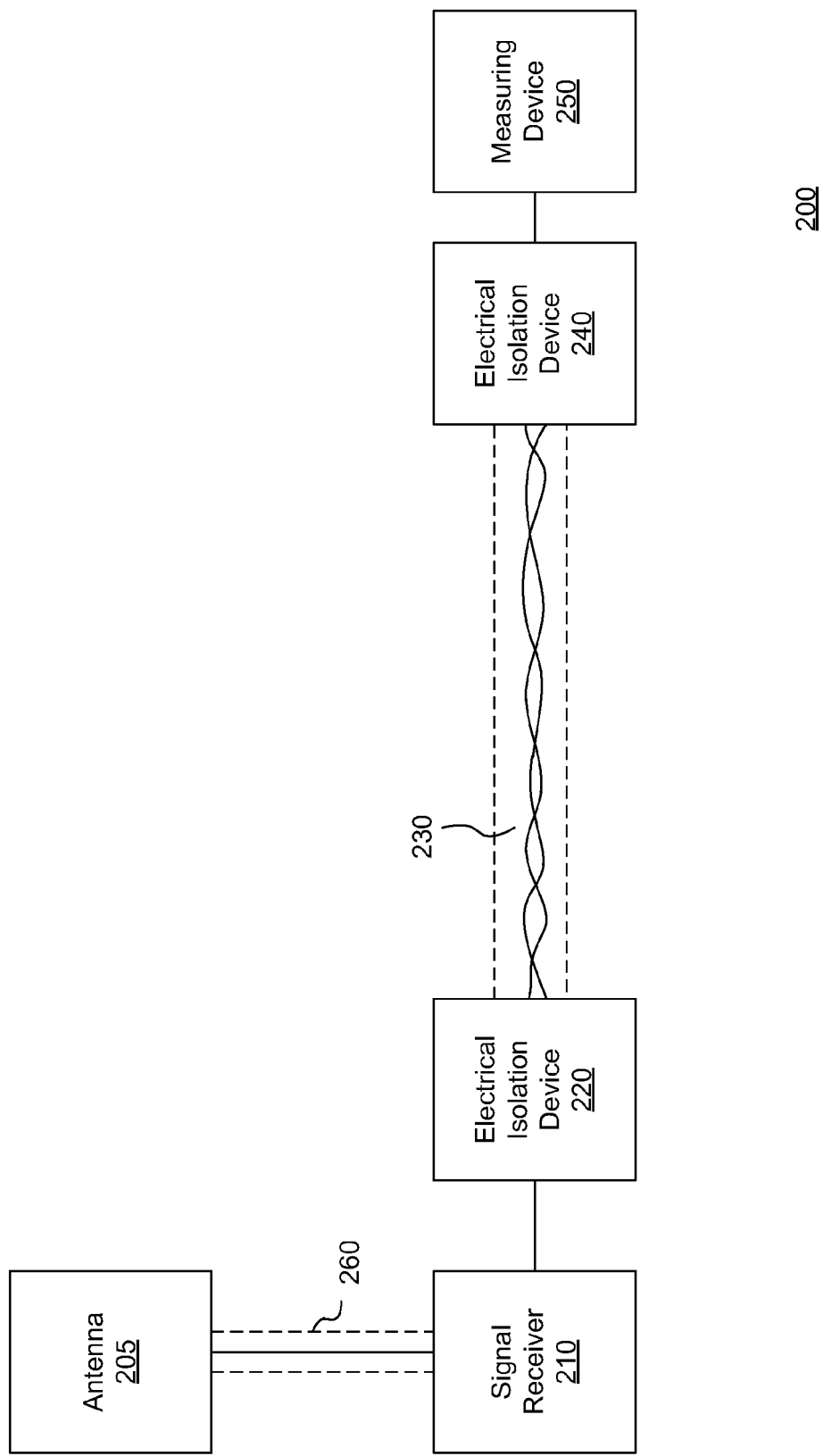
FIG. 2 is a block diagram of a measuring system according to one embodiment of the invention.

FIG. 2 illustrates an exemplary measuring system 200 according to one embodiment of the invention. As a person skilled in the art would understand, the measuring system 200 may be constructed in any number of ways within the scope of the present invention. The methods of FIGS. 1a-1b may be implemented in other systems, and the invention is not limited to system 200.

Measuring system 200 includes a signal receiver 210 that receives a first signal via antenna 205. In the preferred embodiment, the signal is a GPS timing signal from a GPS satellite, but the signal may be any other type of signal within the scope of the present invention. The first signal is transmitted to the signal receiver 210, which generates a second signal. The signal receiver 210 is operatively coupled to an electrical isolation device 220. The electrical isolation device 220 electrically isolates the signal receiver 210 from a first cable 230 and generates a third signal from a second signal. The electrical isolation device(s) may be an opto-isolator, which operates by transferring electrical signals by utilizing light waves to provide coupling with electrical isolation between its input and output. The electrical isolation device 220 is operatively coupled to the first cable 230, which, in turn, is operatively coupled to another electrical isolation device 240. The electrical isolation device 240 is used to generate a fourth signal from the third signal. The electrical isolation device 240 is operatively coupled to a measuring device 250, which, in turn, is operatively coupled to the alternating current power grid. The measuring device 250 periodically measures a parameter on the alternating current power grid.

As stated above, the measuring device 250 calibrates the signal it receives by a delay constant to compensate for delays in transmitting the signal from the antenna 205 to the measuring device 250. In some embodiment, the delay constant factors in delays caused only by the first and second isolation devices 220, 240 and the first cable 230, in which case the delay constant may be calculated by adding the specified propagation delays of the electrical isolation devices 220, 240 and the expected time for an electrical signal to propagate through the first cable 230 given the length of the first cable 230. In some cases, the second cable 260 is very short, or even is not used if the antenna 205 is integrated into the signal receiver 210. However, when the second cable 260 that connects the antenna 205 to the signal receiver 210 is long (e.g., >10 meters), the delay caused by the second cable 260 is also added to the delay constant.

In certain embodiments, the first cable 230 includes at least two pairs of twisted wires for bi-directional signal flow between the signal receiver 210 and the measuring device 250. In such embodiments, the delay constant may be calculated by measuring a round trip signal travel time in the first cable 230, between the measuring device 250 and the signal receiver 210, and dividing the time by approximately 2. In certain embodiments, the delay constant may be calculated by comparing the signal received at the measuring device 250 (i.e., the fourth signal) with the signal received at the antenna 205 (i.e., the first signal) at the same point in time. The difference between the signals at the same point in time is stored as the delay constant.

Figure 3:
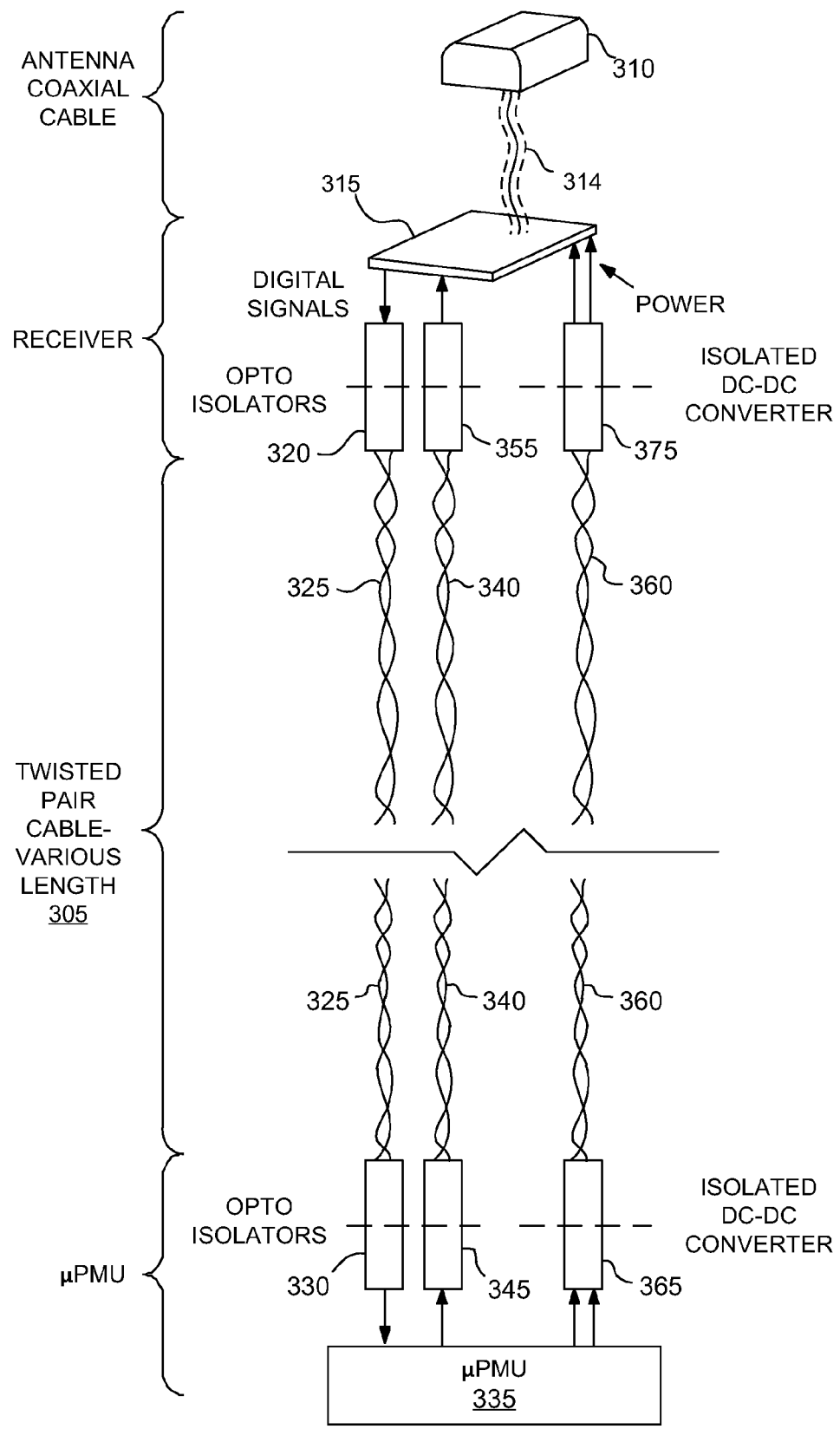
FIG. 3 is a schematic representation of another measuring system according to one embodiment of the invention.

FIG. 3 is an example implementation of the system illustrated in FIG. 2. In this example, the system includes an antenna 310 and signal receiver 315 that receive a universally-available timing reference signal (e.g., a GPS timing signal), a μPMU 335 (or a PMU) that measures voltage phase angle on the alternating current power grid relative to the timing reference signal, and a twisted-pair cable 305 that couples the μPMU 335 and the signal receiver 315. Twisted-pair cable 305, which may be of variable length, includes three pairs of twisted wire 325, 340, 360. Twisted wire pair 325 transmits the timing reference signal from the signal receiver 315 to the μPMU 335. Twisted wire pair 340 transmits control signals from the μPMU 335 to the signal receiver 315, and twisted wire pair 360 transmits power from the μPMU 335 to the receiver 315. In certain embodiments, a second coaxial cable 314 connects the antenna 310 and the signal receiver 315.

The timing reference signal is transmitted from the antenna 310 to the signal receiver 315 to the μPMU 335 along twisted wire pair 325 through a first opto-isolator 320, which electrically isolates the twisted wire pair 325 from the signal receiver 315, and a second opto-isolator 330, which electrically isolates the twisted wire pair 325 from the μPMU 335. Similarly, control signals are transmitted from the μPMU 335 to the signal receiver 315 along twisted wire pair 340 through opto-isolator 345 and opto-isolator 355. Power is transmitted from the μPMU 335 to the signal receiver 315 via twisted wire pair 360 through an isolated DC-DC converter 365, which electrically isolates the μPMU 335 from twisted wire pair 360, and through an isolated DC-DC converter 375, which electrically isolates twisted wire pair 360 from the signal receiver 315. Each isolated DC-DC converter derives an output DC power supply from an input DC power supply, wherein the input and output power supplies are electrically isolated. Electrical isolation devices 320, 355, and 375 either may be built into the signal receiver 315 or externally coupled to the signal receiver 315. Similarly, electrical isolation devices 330, 345, and 365 either may be built into the μPMU 335 or externally coupled to the μPMU 335.

In one embodiment, a firmware-activated switch (not shown) connects the signals carried on twisted wire pairs 325 and 340 at the signal receiver 315 for the purpose of determining the delay caused by opto-isolators 320, 330, 345, 355 and twisted-pair cable 305. The switch is normally open, except that, when calculating the delay, the μPMU 335 closes the switch (via a control signal) and sends a signal up twisted wire pair 340. Since the switch is closed the signal will return to the μPMU 335 via twisted wire pair 325. The μPMU 335 measures the round trip time and divides it by approximately 2. The resulting value is stored as the delay constant used to calibrate the timing reference signal received at the μPMU 335. In certain embodiments, when the second coaxial cable 314 is long (e.g., >10 meters), the expected time for the electrical signal to propagate through the second coaxial cable 314 is added to the delay constant.

As will be understood by those familiar with the art, the invention may be embodied in other specific forms without departing from the spirit or essential characteristics thereof. Accordingly, the above disclosure of the present invention is intended to be illustrative and not limiting of the invention.

The invention claimed is:

1. A method for measuring a parameter of an alternating current power grid with a measuring system that includes an antenna exposed to the sky, a signal receiver coupled to the antenna, and a measuring device coupled to the signal receiver via a cable, the method comprising:
   receiving a first signal at the antenna;
   transmitting the first signal to the signal receiver;
   generating a second signal at the signal receiver;
   generating a third signal based on the second signal and electrically isolated from the second signal;
   transmitting the third signal in the cable toward the measuring device;
   generating a fourth signal based on the third signal and electrically isolated from the third signal;
   transmitting the fourth signal to the measuring device;
   calibrating the fourth signal by subtracting a delay constant from the fourth signal, wherein the delay constant approximates the delay between receipt of the first signal at the antenna and a receipt of the fourth signal at the measuring device; and
   measuring a parameter on the alternating current power grid relative to the calibrated fourth signal.

2. The method of claim 1, wherein a first digital isolation device is used to generate the third signal from the second signal and wherein a second digital isolation device is used to generate the fourth signal from the third signal.

3. The method of claim 2, wherein the delay constant is calculated by adding the specified propagation delays of the first and second digital isolation devices and an expected time for an electrical signal to propagate through the cable given the length of the cable.

4. The method of claim 1, wherein a second cable couples the antenna and the signal receiver and wherein an expected time for an electrical signal to propagate through the second cable is added to the delay constant.

5. The method of claim 1, wherein the delay constant is calculated by comparing the fourth signal with the first signal at a same point in time, wherein the difference between the signals at said same point in time is stored as the delay constant.

6. The method of claim 1, wherein the cable includes at least two pairs of twisted wires for bi-directional signal flow between the signal receiver and the measuring device and the delay constant is calculated by measuring a round trip signal travel time between the signal receiver and the measuring device and dividing the time by approximately 2.

7. The method of claim 1, further comprising:
   generating a first power supply at the measuring device;
   generating a second power supply derived from the first power supply and electrically isolated from the first power supply;
   transmitting the second power supply in the cable toward the signal receiver;
   generating a third power supply derived from the second power supply and electrically isolated from the second power supply; and
   transmitting the third power supply to the signal receiver to supply power to the signal receiver from the measuring device.

8. The method of claim 7, wherein a first isolated DC-DC converter is used to generate the second power supply from the first power supply and a second isolated DC-DC converter is used to generate the third power supply from the second power supply.

9. The method of claim 1, wherein the first signal is a timing signal.

10. The method of claim 9, wherein the timing signal is a GPS timing signal from a GPS satellite.

11. The method of claim 1, wherein the parameter is voltage phase angle, the measuring device is a phasor measuring unit, and the first signal is a timing reference signal against which a voltage phase angle on the alternating current power grid is measured.

12. A system for measuring a parameter of an alternating current power grid comprising:
- a measuring device operatively coupled to the alternating current power grid that periodically measures a parameter on the alternating current power grid;
- a signal receiver coupled to an antenna for receiving a signal;
- a cable for transmitting the signal from the signal receiver to the measuring circuit;
- a first electrical isolation device that couples the cable and the signal receiver for electrically isolating the cable from the signal receiver; and
- a second electrical isolation device that couples the cable and the measuring device for electrically isolating the cable from the measuring device, wherein the signal travels from the signal receiver to the measuring device through the first electrical isolation device, along the cable, and then through the second electrical isolation device.

13. The system of claim 12, wherein the measuring device calibrates the signal by a delay constant to compensate for delay in the cable and the first and second electrical isolation devices.

14. The system of claim 13, wherein the delay constant is calculated by adding the specified propagation delays of the first and second electrical isolation devices and the expected time for an electrical signal to propagate through the cable given the length of the cable.

15. The system of claim 13, wherein the delay constant is calculated by comparing a first signal received at the signal receiver with a second signal received at the measuring device at a same point in time, wherein the difference between the first and second signals at said same point in time is stored as the delay constant.

16. The system of claim 13, wherein the cable includes at least two pairs of twisted wires for bi-directional signal flow between the signal receiver and the measuring device and the delay constant is calculated by measuring a round trip signal travel time in the cable and dividing the time by approximately 2.

17. The system of claim 12, wherein a second cable couples the antenna and the signal receiver, and the delay constant also compensates for a delay in the second cable.

18. The system of claim 12, wherein the parameter is a voltage phase angle, the measuring device is a voltage phasor measuring unit, the signal is a GPS signal, and the signal receiver is a GPS signal receiver.

* * * * *